United States Patent [19]
Gotoh et al.

[11] Patent Number: 5,352,324
[45] Date of Patent: Oct. 4, 1994

[54] ETCHING METHOD AND ETCHING APPARATUS THEREFOR

[75] Inventors: Yasushi Gotoh, Kokubunji; Tokuo Kure, Tokyo; Hiroshi Kawakami, Hachioji; Masanori Katsuyama, Ome; Kiyomi Yagi, Hamura; Hiromichi Enami, Tachikawa, all of Japan

[73] Assignee: Hitachi, Ltd., Tokyo, Japan

[21] Appl. No.: 136,947

[22] Filed: Oct. 18, 1993

[30] Foreign Application Priority Data

Nov. 5, 1992 [JP] Japan .................. 4-296039
Mar. 12, 1993 [JP] Japan .................. 5-051122

[51] Int. Cl.⁵ .............. H01L 21/306; B44C 1/22; C03C 15/00; C03C 25/06
[52] U.S. Cl. .................. 156/643; 156/657; 156/662; 156/345
[58] Field of Search .......... 156/643, 646, 656, 657, 156/659.1, 662, 345; 204/298.34, 298.37, 298.38

[56] References Cited

U.S. PATENT DOCUMENTS 4,705,595 11/1987 Okudaira et al. ............... 156/643
4,808,258 2/1989 Otsubo et al. .................. 156/345 X
5,236,549 8/1993 Shirakawa et al. ............. 156/656 X

FOREIGN PATENT DOCUMENTS 59-222933 12/1984 Japan .
2-253617 10/1990 Japan .
3-155620 7/1991 Japan .

Primary Examiner—William Powell
Attorney, Agent, or Firm—Fay, Sharpe, Beall, Fagan, Minnich & McKee

[57] ABSTRACT

Disclosed is an etching method and an apparatus for performing an etching by alternately and repeatedly switching an average thickness of an ion sheath and an average energy of etching ions between two different values. Since the etchant absorption to the surface of an article to be etched and the etching by ions are effectively performed, it is possible to reduce the influence of an aspect ratio on an etching depth, and hence to perform the etching with an equal depth even if the width of the opening is changed.

16 Claims, 16 Drawing Sheets

ADSORPTION OF
ETCHING SPECIES
Toff

DESORPTION OF
REACTION PRODUCTS
Ton

◎ REACTION PRODUCTS
○ ETCHANT
● ION

ETCHING METHOD AND ETCHING APPARATUS THEREFOR

BACKGROUND OF THE INVENTION

The present invention relates to an etching method and an etching apparatus, and particularly to an etching method capable of performing an etching with high selectivity and high anisotropy using a high density plasma under a low gas pressure, and an etching apparatus for carrying out the etching method.

In recent years, as the integration density of a semiconductor integrated circuit has been enhanced, the dimensions of patterns formed by etching in the manufacturing process have been further minimized. As the dimension of a pattern formed by etching is minimized, the aspect ratio of the pattern is inevitably increased, and accordingly the aspect ratio dependency of the etching rate is at stake. Namely, along with the increased aspect ratio, it has been difficult to make larger the etching rate.

An etching process involves irradiating energetic ions (hereinafter, referred to as etching ions, or simply as ions) for etching on the surface of an article to be etched absorbed with an etchant; forming reaction products between the etchant and surface components of the article to be etched by impact of the ions; and desorbing the reaction products from the surface of the article to be etched; thereby obtaining the desired pattern.

In this case, only ions accelerated by an electric field are perpendicularly incident on the surface of an article to be etched, and an etchant is incident on the surface of the article to be etched from the random directions. Accordingly, to reduce the aspect ratio dependency of the etching rate, it is required that etching ions are perpendicularly incident on the surface of the article to be etched. In this regard, various techniques have been proposed. To arrange the advancing directions of the etching ions for allowing the etching ions to be perpendicularly on the surface of the article to be etched, there is known a method of reducing the gas pressure of plasma. This method is intended to improve the advancing directions of the etching ions by reducing the scattering of the etching ions through the collision between the etching ions and neutral particles in an ion sheath. Further, in this case, since the densities of the etchant and the etching ions are lowered when the gas pressure is reduced, the etching rate is inevitably reduced. For preventing the reduction in such an etching rate, there has been proposed a technique of applying a magnetic field in plasma for forming a high density plasma.

Additionally, in formation of an ultra large scale integrated circuit (ULSI), the thinning of a mask and a bottom layer has been advanced, and the etching technique excellent in high selectivity and in low damage has been required. To meet the requirements, the lowering of the energy of etching ions has been performed.

As the etching apparatus of performing the etching under a low gas pressure and a low ion energy for satisfying both requirements, an etching apparatus using microwave discharge [called ECR (electron cyclotron resonance) etching apparatus] has been put in practice, and further, its improvement has been advanced. For example, Japanese Patent Laid-open No. HEI 2-253617 discloses an etching apparatus, wherein a DC current superimposed with an AC current is allowed to flow in an electric magnet disposed around a reactor for improving the plasma uniformity, thereby enhancing the etching rate. Further, Japanese Patent Laid-open No. HEI 3-155620 discloses an apparatus, which is intended to intermittently generate a plasma by switching a microwave power supply for generating a plasma synchronously with a DC bias power supply for accelerating ions. In this apparatus, the matching of the DC bias is effectively achieved, to reduce the loss of the bias power, thus enhancing the etching rate.

In the above-described prior art etching methods and apparatuses, for improving the directional uniformity of etching ions and for lowering the energy, a high density plasma has been generated under a low gas pressure, and the magnitude of a radio frequency bias power for accelerating ions has been reduced. These prior art techniques has given consideration in reducing the scattering of ions assisting etching for improving the directional uniformity of ions; however, these methods and apparatuses have not given sufficient consideration in improving the uniformity of ions in an accelerated electric field and in supplying an etchant in a sufficient amount. Accordingly, for example, in formation of trench or hole patterns by etching, there occurs such a disadvantage that the supply of an etchant to the bottom portion of a trench or a hole is insufficient, and thus, although etching ions are approximately perpendicularly incident on the surface of an article to be etched, the etching rate at the portion with a high aspect ratio is lowered, thus making it impossible to obtain the sufficient depth of etching. As the etching dimension has been minimized, the aspect ratio has been further enlarged. Consequently, the above problem has become more and more important.

In addition, there occurs such an inconvenient phenomenon that etching ions are curved by a local electric field strain such as the charge-up of a mask on the article to be etched, and the pattern thus obtained becomes oblique. The phenomenon of curving ions is generated by the concentration of an electric field due to pattern steps present on the surface of an article to be etched. As a high density plasma is formed for increasing an etching rate, the thickness of an ion sheath is made thin relatively to the dimension of the step of the pattern formed by etching, ions are more largely curved. As a result, the above phenomenon has become furthermore important.

SUMMARY OF THE INVENTION

Accordingly, an object of the present invention is to solve the above-described problems of the prior art, and to provide an etching method with a high accuracy and a high selectivity capable of making extremely small the aspect ratio dependency and of forming a fine pattern with perpendicular side surfaces, and an etching apparatus for carrying out the etching method.

The above object can be achieved by intermittently changing the output of a radio frequency power supply connected to a wafer stand for holding an article to be etched thereon or the intensity of a magnetic field applied to a plasma, thereby alternately repeating the switching between a plurality of states different from each other, for example, between a state that the average value d of an ion sheath and the average ion energy $V_S$ are respectively taken as $d_1$ and $V_{S1}$, and the other state that the above values d and $V_S$ are respectively taken as $d_2$ and $V_{S2}$ ($d_2 > d_1$, $V_{S2} > V_{S1}$).

Namely, in the present invention, under the state that a plasma for producing etching ions is continuously generated, the output of a radio frequency power supply connected to a wafer stand for supporting an article to be etched is intermittently changed between different outputs, or the intensity of a magnetic field applied in the plasma is intermittently changed by a magnetic field generating means disposed around a plasma generating chamber, so that the thickness d of the average ion sheath of a plasma is intermittently (periodically) changed between the thick state and the thin state.

First, in the state that the thickness d of the average ion sheath is thin ($d=d_1$), the output of the radio frequency power supply is decreased, to lower the average ion energy $V_S$ ($V_S=V_{S1}$). In this period of time, the sufficient etchant is supplied in the state that the etching reaction is suppressed. In the subsequent state that the thickness d of the average ion sheath is thick ($d=d_2$), the output of the radio frequency power supply is increased, to enhance the average ion energy $V_S$ ($V_S=V_{S2}$), thus accelerating the etching reaction. However, it is undesirable to enhance the average ion energy $V_{S2}$ unconditionally, and actually, the average ion energy $V_{S2}$ is required to be selected within such a range as to obtain a high selectivity with respect to a mask used, to thus improve the etching selectivity.

As described above, in the present invention, in the state that a plasma for producing etching ions is continuously generated, the switching between the above two states is periodically repeated, to achieve the desired etching. Consequently, the etching ions can be irradiated in such a state that the etchant is sufficiently supplied to the portion with a high aspect ratio. This makes it possible to effectively reduce the aspect ratio dependency of the etching rate, which has been at stake in the prior art.

Further, in the state that the average ion sheath d is thick ($d_2$), by setting of this thickness $d_2$ to be 10 times or more as much as the dimension of a pattern step on the surface of an article to be etched and also to be shorter than the mean free path of ions, it is possible to reduce the influence of the electric field strain and the charge-up in the vicinity of the above pattern step portion, and hence to allow ions to be perpendicularly incident on the surface of the article to be etched.

According to the present invention, it is possible to independently control the supply of an etchant and the ion irradiation with a relatively high energy for accelerating the etching, and hence to achieve the preferable perpendicular etching.

DETAILED DESCRIPTION OF THE PREFERRED EMBODIMENTS

EXAMPLE 1

In this example, etching is performed using a microwave plasma etching apparatus under the condition that a radio frequency voltage applied to an article to be etched is periodically changed.

Figure 1:
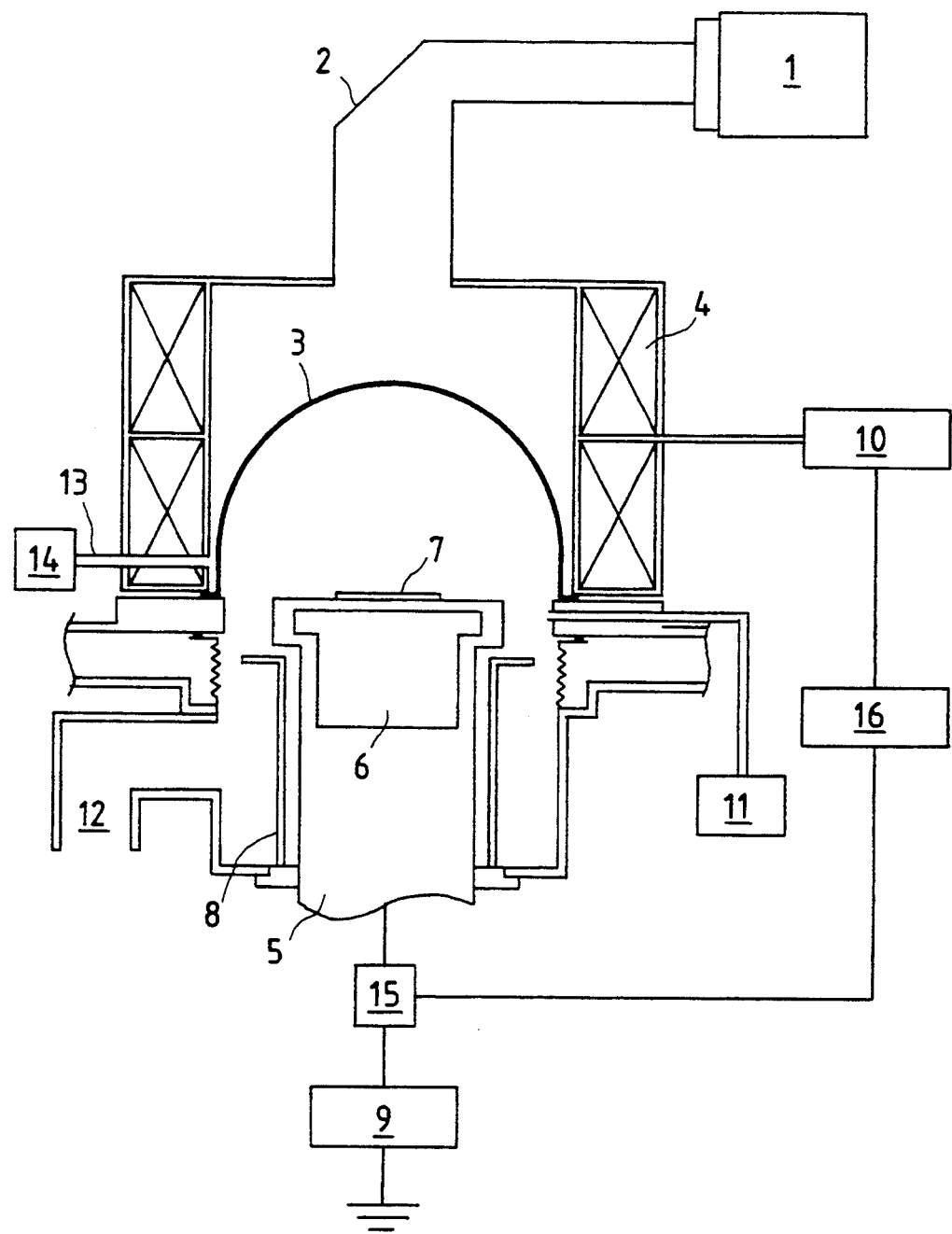
FIG. 1 is a view of main parts of a microwave plasma etching apparatus of the present invention.

FIG. 1 is a schematic view showing the construction of main parts of the microwave plasma etching apparatus used in this example. In FIG. 1, the following units in this apparatus are the same as those in the prior art microwave plasma etching apparatus: namely, a microwave generating power supply 1; a wave guide 2; a microwave transmitting vacuum vessel (discharge tube) 3; a magnetic field generating magnetic coil 4; a wafer stand 5; a temperature control equipment 6 for an article to be etched; an article to be etched 7; an electrode 8; a radio frequency power supply 9; a power supply for magnetic coil 10; a discharge gas introducing system 11; a gas discharge port 12; a plasma lightening window for light emitting monitor 13; and a light emitting monitor processing unit 14.

In the above construction, the article 7 to be etched is placed on the wafer stand 5 and the interior of the discharge tube 3 is pumped in vacuum, after which a discharge gas containing an etching gas is introduced from the gas discharge gas introducing system 11 in the discharge tube 3. In such a state, a microwave power is supplied from the microwave generating power supply 1 in the discharge tube 3 through the wave guide 2 for generating a microwave discharge plasma in the discharge tube 3. Further, a magnetic field with a suitable intensity is applied to the generated plasma by the magnetic coil 4, to enhance the density of the generated plasma. The discharge gas is excited and dissociated in this high density plasma, to produce etching ions and a reactive etchant. The etching is performed for the surface of the article to be etched by the aid of the etching ions and the etchant. In addition, the operation and the function of the prior art apparatus are well-known, and the explanation thereof is omitted.

In this example, as is apparent from FIG. 1, in addition to the prior art apparatus, between the radio frequency power supply 9 and the wafer stand 5, a chopping system 15 for applying a radio frequency power to the article 7 to be etched while intermittently repeating the switching between the different values is newly provided, and further, a synchronous control mechanism 16 for synchronously controlling the chopping system 15 and the power supply 10 for magnetic coil is provided. A current supplied from the power supply 10 for magnetic coil to the magnetic coil 4 is intermittently changed by the synchronous control mechanism 16 under two different conditions, so that the state of plasma continuously generated and kept in the discharge tube 3 is intermittently and repeatedly changed under the two different conditions. Synchronously with the change in the state of plasma, a radio frequency power applied from the radio frequency power supply 9 to the wafer stand 5 is intermittently and repeatedly changed between the two different values. Additionally, in place of the above chopping system 15, a means for intermittently changing the same radio frequency power applying condition as described above to the article to be etched may be, of course, additionally provided in the output system of the radio frequency power supply 9, to thereby directly control the above functioning means on the basis of a control signal from the synchronous control mechanism 16. Namely, any type of functioning means may be used insofar as it can intermittently change the radio frequency power applying condition to the article to be etched.

Figure 2:
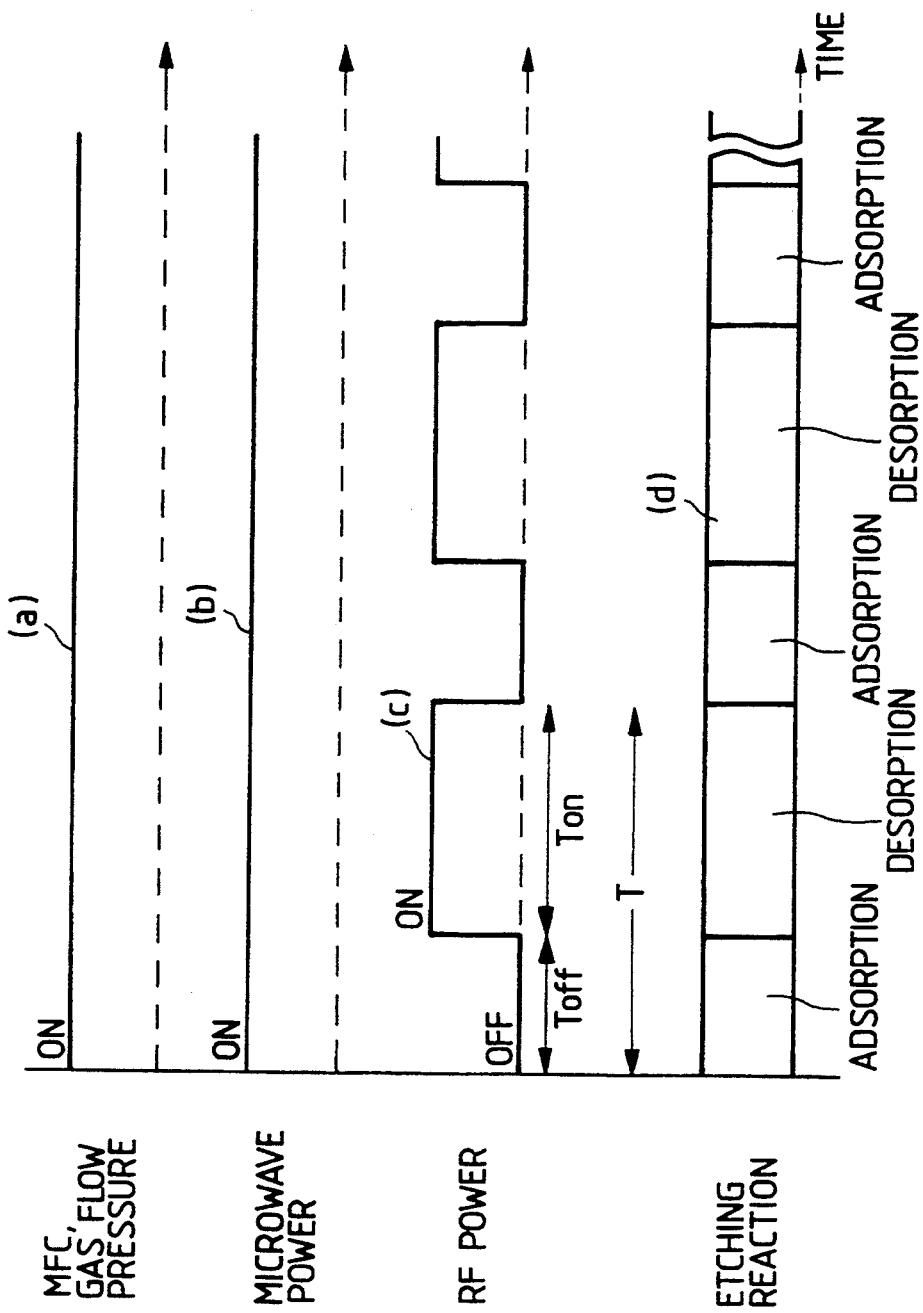
FIG. 2 is a basic flow chart of an etching method of the present invention.

FIG. 2 shows a basic flow chart of an etching method of the present invention which is carried out by use of the apparatus as shown in FIG. 1. In FIG. 2, (a) shows a pressure condition for a gas introduced in a plasma; (b) shows a microwave ($\mu$ wave) power supplied in a plasma; (c) shows a change in a radio frequency power (RF power) applied to an article to be etched; and (d) shows a change in the reaction mechanism of etching on the surface of the article to be etched. Further, FIG. 3 is a view showing the concept of a change in the reaction mechanism of etching (absorption of etching species and desorption of reaction products) in etching according to the above etching flow chart.

In this example, an etching gas was introduced in the discharge tube 3 at a constant flow rate so that the gas pressure in the discharge tube 3 was kept constant [(a) in FIG. 2], and concurrently a microwave power with a specified intensity was charged in the discharge tube 3 [(b) in FIG. 2] for generating a microwave discharge plasma in the discharge tube 3. After that, in such a state that the above plasma was continuously generated (discharged), the ON state and the OFF state of the radio frequency power applied to the article 7 to be etched were repeated [(c) in FIG. 2]. Thus, the absorption of species and the desorption of reaction products were alternately repeated [(d) in FIG. 2].

Figure 3A:
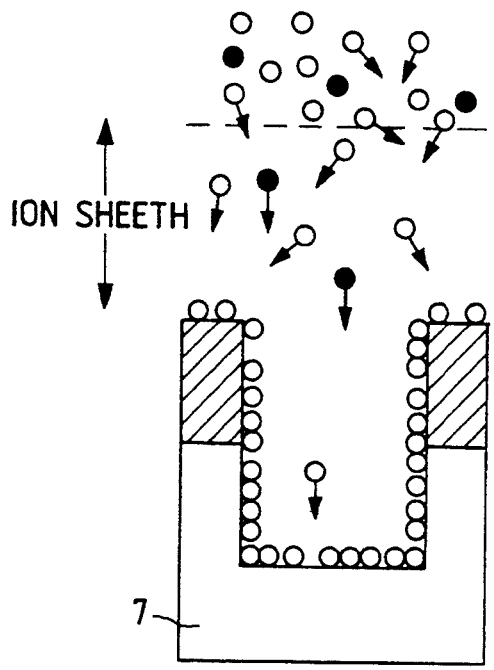
FIGS. 3(a) and 3(b) are views for explaining the change in the reaction mechanism of etching.

In each OFF time ($T_{off}$) when the applying of the radio frequency power to the article 7 to be etched was in the OFF-state, the thickness of the ion sheath was thin, and the energy of the produced etching ions was low, so that the etching little proceeded and the absorption of the etchant (etching species) was preferentially performed. In this period of time ($T_{off}$), as shown in FIG. 3(a), the surface of the article 7 to be etched was covered with at least one or more layers of the etchant.

Figure 3B:
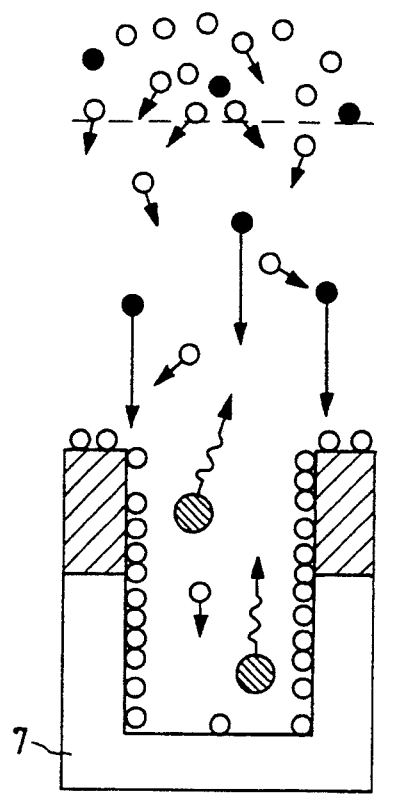

Next, in a cycle time ($T_{on}$) when the applying of the radio frequency to the article 7 to be etched was in the ON-state, the thickness of the ion sheath become thicker, and the energy of the etching ions become higher, so that the sufficient etching reaction proceeded as shown in FIGS. 3(b).

By repeating of these operations with a cycle (T) shorter than one second, the etching was performed in such a state that the etchant was sufficiently supplied, to thereby achieve the etching with a high etching reaction efficiency. In addition, if the microwave ($\mu$ wave) is periodically (intermittently) supplied to give a power-off period for stopping the generation of a microwave discharge plasma, the intermittent applying of the radio frequency power to the article to be etched may be repeated as described within the period of time when the plasma is generated.

Figure 4A:
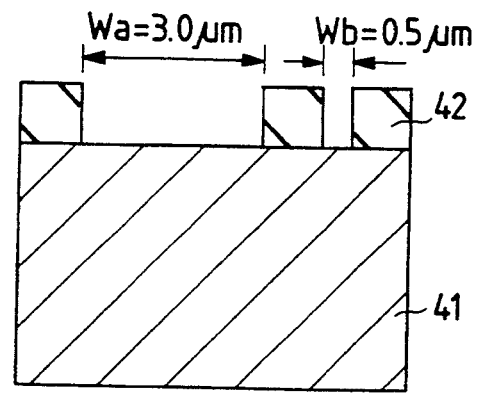
FIGS. 4(a) to 4(c) are graphs for explaining the effect of the present invention.

There will be described an etching using the etching apparatus as shown in FIG. 1, which is performed for a Si substrate 41 formed with a resist mask 42 on its surface as shown in FIG. 4(a) using a $SF_6$ gas. First, the Si substrate 41 was carried in the discharge tube 3 and was fixed on the wafer stand 5 cooled by the temperature control equipment 6. Thus, the temperature of the Si substrate 41 was kept at $-130°$ C. Subsequently, a discharge gas containing a $SF_6$ gas was introduced in the discharge tube 3 at a flow rate of 25 sccm, and the pressure in the discharge tube 3 was kept at 10 mTorr (constant). In such a sate, a current was applied to the magnetic coil 4 for supplying a microwave power from the wave guide 2 into the discharge tube 3, to thus generate a gas discharge plasma in the discharge tube 3.

Next, a control signal was transmitted from the synchronous control mechanism 16 to the chopping system 15 provided between the radio frequency power supply 9 and the wafer stand 5 for alternately switching the radio frequency applied to the article 7 to be etched between 0W (OFF state) and 5W (ON state) with a cycle of 0.5 sec, thus etching the Si substrate 41 through openings with widths $W_a$ and $W_b$ of 3 $\mu$m and 0.5 $\mu$m. The sectional shape of the pattern thus obtained was as shown in FIG. 4(c). On the contrary, the sectional shape of the pattern, which was obtained by the etching according to the prior art under the condition that the applying of the radio frequency power to the article 7 to be etched was 5W (constant), was as shown in FIG. 4(b).

Figure 4B:
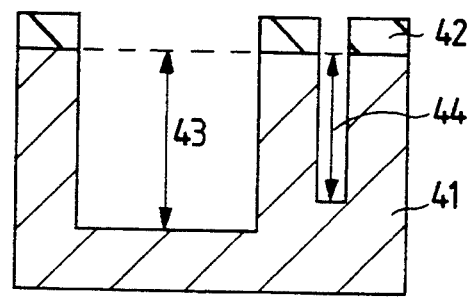
Figure 4C:
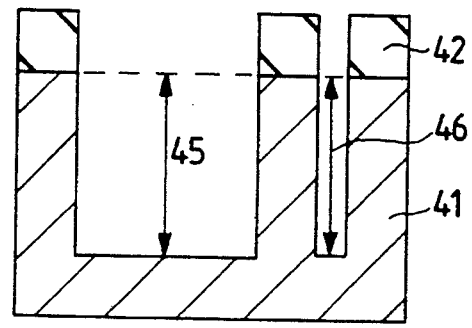

As is apparent from the comparison between the sectional shapes as shown in FIGS. 4(b) and 4(c), as compared with the prior art method, this example is significantly improved in the etching selectivity and the aspect ratio dependency with respect to the resist. Namely, although the etching selectivity of the silicon to the resist is about 40 in the prior art method, the etching selectivity in this example is about 100. Accordingly, in this example, the etching selectivity is improved by about 2 times or more and a decrease in the film thickness of a resist film 42 is made smaller than that in the prior art method. Further, in the prior art method, an etching depth 44 at the opening with the width $W_b$ of 0.5 $\mu$m was smaller than the etching depth 43 at the opening with the width $W_a$ of 3 $\mu$m by about 20%. In this example, however, an etching depth 46 at the opening with the width $W_b$ of 0.5 $\mu$m was almost similar to the etching depth 43 at the opening with the width $W_a$ of 3.0 $\mu$m, and accordingly, the influence by the aspect ratio was little recognized.

Figure 5:
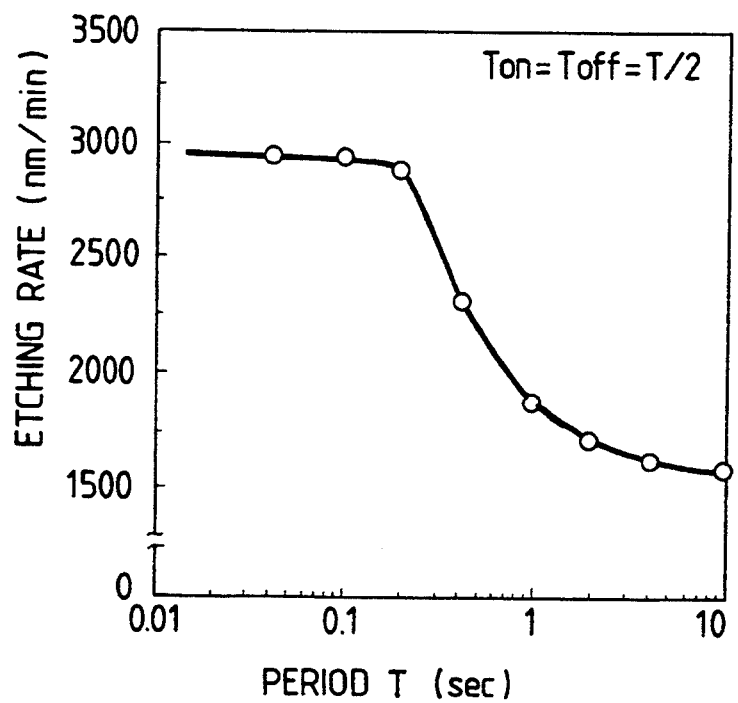
FIG. 5 is a graph for explaining the effect of the present invention.

The reason why the above-described excellent effect is obtained in this example will be described with reference to FIG. 5. FIG. 5 shows a change in the etching rate in the case that the ON time and the OFF time in applying of the radio frequency power to the article to be etched are equal to each other ($T_{ON}=T_{off}$) and the cycle time T is changed. The result as shown in FIG. 5 was obtained as follows: namely, by use of the etching apparatus as shown in FIG. 1, etching was performed for the article to be etched as shown in FIG. 4(a) under the condition that a $SF_6$ gas was introduced at a flow rate of 25 sccm under the pressure of 10 mTorr; and the radio frequency power applied to the article to be etched was periodically switched between the 0W (OFF) state and the 5W (ON) state. In addition, in the prior art etching method performed by continuously applying a radio frequency power of 5W to the article to be etched, the etching rate was about 3.5 μm/min; and in the prior art etching method performed by applying no radio frequency power, the etching rate was about 0.1 μm/min. According to the present invention, however, as is apparent from FIG. 5, when the cycle time T was longer (about 10 sec), the etching rate was reduced to be about 1.5 μm/min; but when the cycle time T was shortened (less than 1 sec), the etching rate was significantly increased, and saturated at the cycle time of 0.1 sec or less. The reason for this is considered as follows: namely, in the case that the cycle time T is longer, the etching rate is taken as an average value between those obtained in etching by applying no radio frequency power and in etching by continuously applying a radio frequency power of 5W; however, as the cycle time T is shortened, the process for absorption of an etchant and the process for desorption of reaction products are effectively performed. In addition, under the condition as shown in FIG. 5, it is mostly suitable that the applying time $T_{ON}$ of the radio frequency power after the saturated absorption of the etchant is 0.1 sec.

Figure 6:
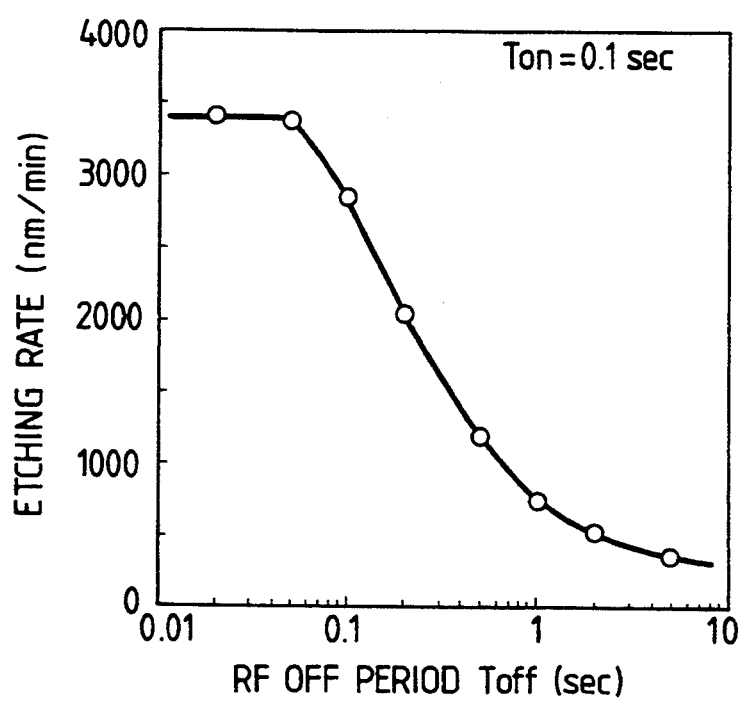
FIG. 6 is a graph for explaining the effect of the present invention.

Next, the effect of provision of the time $T_{off}$ when the radio frequency power is not applied to the article 7 to be etched will be described with reference to FIG. 6. FIG. 6 shows the result obtained the etching using the etching apparatus as shown in FIG. 1 and the article to be etched as shown in FIG. 4(a), wherein the change in the etching rate at the portion of the width of 0.5 μm is examined under the condition that the cycle $T_{ON}$ is fixed at 0.1 sec when the radio frequency power applied to the article 7 to be etched is 5W, and the cycle $T_{OFF}$ is changed when the radio frequency power is in the 0W (RF off) state. The other conditions are set to be the same as in the case of FIG. 5.

As is apparent from FIG. 6, as the cycle $T_{off}$ in the state (RF off) that the radio frequency power was not applied was shortened, the etching rate was increased, and was almost saturated at the cycle of 0.05 sec or less. However, the etching rate at the portion with the width of 3.0 μm was not saturated when the cycle become 0.05 sec or less, and the aspect ratio dependency was again generated. The reason for this is considered as follows: namely, under this condition, the supply of the etchant is almost saturated at the cycle of 0.05 sec, and the absorption amount is not increased even when the absorption time ($T_{off}$) is made longer, so that the waste time is increased and the etching rate is reduced; however, when the absorption time $T_{off}$ is shortened to be less than 0.05 sec, the absorption amount of the etchant is insufficient at a pattern portion with a high aspect ratio, and thus the aspect ratio dependency is generated.

In the case that three or four atoms of an etchant are absorbed by each of silicon atoms present on the surface of a Si substrate at a density of about $1.4 \times 10^{15}$ pieces/1 cm$^2$, since the incident amount of atoms of the etchant is about $5 \times 10^{18}$ pieces per 1 sec under the gas pressure of 10 mTorr, the atoms of the etchant in the necessary number are incident for about 1 mil-sec. However, the number of atoms of the etchant reaching the bottom portion of a hole or a trench is affected by the aspect ratio, and thus becomes about several % to about 50% of the incident amount, so that at least 0.05 sec is required until the absorption amount is saturated. Thus, for performing the saturated gas absorption, at least the absorption time of 1 mil-sec or more is required. Accordingly, it is preferable that the switching frequency of the radio frequency power intermittently applied to the article to be etched is 1 kHz or less.

In the etching apparatus as shown in FIG. 1, when a low frequency power supply was used in place of the chopping system 15 and the radio frequency power supply 9, the etching accuracy was reduced by the charge-up of an insulating mask such as a resist during one cycle. Accordingly, the desired effect cannot be obtained only by applying the sample bias with a low frequency, but the desired high accurate and high effective etching can be realized by applying the radio frequency power of 1 kHz or more to the article to be etched while modulating the radio frequency in amplitude with low frequency.

In this example, as the etching gas, the SF$_6$ gas was used; however, by use of the other etching gases such as Cl$_2$, while the optimum cycle time T was changed somewhat, the same effect as described above was obtained by intermittently changing the applying of the radio frequency power to the article to be etched.

Further, the available etching apparatus is not limited to the microwave plasma etching apparatus used in the above example, and by use of any plasma etching apparatus capable of independently controlling the generation of plasma and the applying of the high frequency power to the article to be etched, the same effect can be obtained. For example, there may be used a plasma etching apparatus using a plasma generating mechanism such as a helical resonance type or triode type.

Additionally, in the present invention, the absorption of an etchant is sufficiently performed to the article to be etched in plasma continuously generated, and thereafter a radio frequency bias is instantaneously applied, thereby performing the etching by the action of ions with a high anisotropy. Accordingly, in the above absorption of the etchant, the ion irradiation with a low energy to the extent not to generate the significant etching action is allowable. Namely, not only repeating the ON-OFF of the radio frequency bias applied to the article to be etched, but also repeating the switching between the high bias application and the low bias application may be performed.

Example 2

In this example, a polycrystalline Si is etched through a mask made of a SiO$_2$ film using the microwave etching apparatus as shown in FIG. 1. This example is performed for explaining the other effect of the etching under the condition that the radio frequency power applied to the article to be etched is periodically and intermittently changed.

Figure 7A:
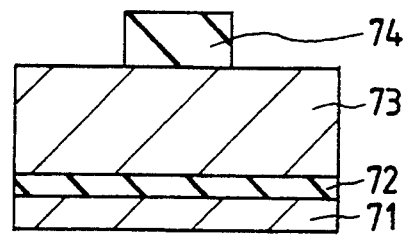
FIGS. 7(a) to 7(d) are processes showing another example of the present invention.

FIGS. 7(a) to 7(d) are processes showing an etching method of the present invention. FIG. 7(a) shows the shapes of an article to be etched before etching, wherein a thermal SiO$_2$ film 72 is grown on a Si substrate 71, and then a polycrystalline Si film 73 and a SiO$_2$ film 74 are deposited, after which the unnecessary portion of the SiO$_2$ film 74 is removed, to thus form a single line pattern.

Figure 7B:
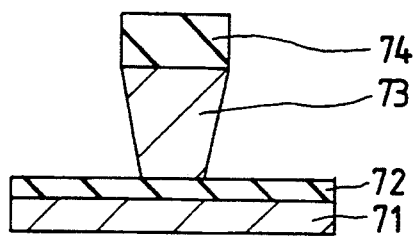
Figure 7C:
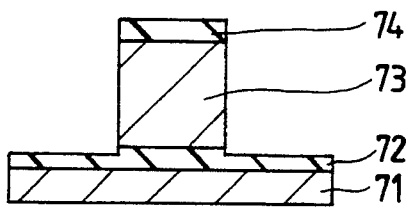

In a reactor (discharge tube) in which a Cl$_2$ gas was introduced at a flow rate of 20 sccm, and the pressure was specified to be 10 mTorr, the above article to be etched was etched. When the polycrystalline Si film 73 was continuously etched under the condition that the radio frequency power applied to the article to be etched was not intermittently changed and the output of the applied radio frequency power was set at a specified value (3W) for increasing the etching selectivity of the polycrystalline Si film 73 to the SiO₂ film 74, the etching section was formed in an inverted taper shape as shown in FIG. 7(b). The reason for this is considered as follows: namely, the average thickness d of the ion sheath formed between a plasma and the surface of the article to be etched is thinner than the pattern step and the accelerated electric field is lower, so that the etching is affected by the electric field strain in the area where the pattern is formed. In the above etching, the etching selectivity of the polycrystalline Si film 73 to the SiO₂ film 74 is about 30. When the continuous etching was performed by use of the same apparatus under the condition that the output of the radio frequency power was set at a specified value (10W) for relaxing the effect of the electric field strain at the pattern portion, the vertical sectional shape as shown in FIG. 7(c) was obtained; however, the etching selectivity at this time was reduced to be about 10.

Figure 7D:
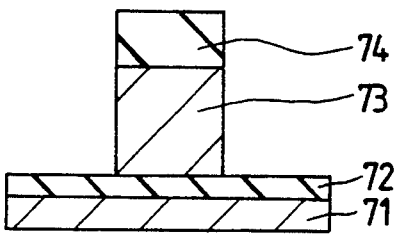

On the contrary, FIG. 7(d) shows the sectional shape obtained by an etching performed by use of the apparatus as shown in FIG. 1 under the condition that the radio frequency power applied to the article to be etched is repeatedly switched between 0W and 10W with each cycle of 0.5 sec. As is apparent from FIG. 7(d), the pattern with the vertical side surfaces is obtained and the etching selectivity is about 30, thus exhibiting the improvement both in the pattern shape and in the etching selectivity. The reason for this is considered as follows: namely, in this example, since the supply of the etchant is saturated and then ions with a high energy are irradiated, the etching effectively proceeds, thus improving the etching selectivity and the etching shape.

Further, in this example, since the etching with little aspect ratio dependency can be achieved, the time for over-etching is reduced, which makes it possible to lower the etching of a SiO₂ film 72 as a bottom layer.

In addition, even when the pattern in which a large number of spaces to be etched such as lines and spaces were arranged were etched using the etching method as shown in this example, the same preferable result was obtained.

Example 3

For manufacturing a more fine and complicated semiconductor device using a plasma etching apparatus, a high selectivity etching technique capable of stably ensuring the etching selectivity of a film to be etched have been required. In particular, the high selectivity etching for a Si₃N₄ film deposited on a SiO₂ film has become extremely important.

Further, in the semiconductor device in future, the diffusion layer becomes shallower in addition to the high integration, and accordingly, the etching with a low damage is also required. In particular, since the above Si₃N₄ film is also used in a diffusion layer forming process of determining the basic characteristics of a semiconductor device, the low energy and anisotropy etching technique is inevitably required in addition to the high selectivity etching.

In addition, the high selectivity etching technique for a Si₃N₄ film is disclosed, for example, in Japanese Patent Laid-open No. SHO 59-222933. In this etching method, the high selectivity etching for a Si₃N₄ film is realized using a reactive ion etching apparatus using a CH₂F₂ gas or CH₃F gas under a vacuum of 0.01 to 0.1 Torr.

A Si₃N₄ film and a SiO₂ film were respectively etched using a CH₂F₂ gas by a microwave ECR system plasma etching apparatus and the etching selectivity therebetween (etching rate of Si₃N₄ film/etching rate of SiO₂ film) was required. As a result, the high selectivity of about 40 was obtained.

However, even when a Si₃N₄ film deposited on a SiO₂ film is etched using the above apparatus and the etching gas, the above high selective ratio cannot be obtained. The reason for this is that, N₂ largely generated in etching of the Si₃N₄ film reacts with an etching gas (CH₂F₂) continuously supplied in the etching chamber, to thus produce the etchant for the SiO₂ film.

Namely, in the initial stage of the etching for the Si₃N₄ film, the etching gas (CH₂F₂) is dissociated on the basis of the following equation (1), to generate fluorine (F).

$$CH_2F_2 \rightarrow CH_2F + F \qquad (1)$$

Then, the etching for the Si₃N₄ film using fluorine (F) as an etchant is started on the basis of the following equation (2).

$$12F + 3Si_3N_4 \rightarrow 3SiF_4 + 6N_2 \qquad (2)$$

Next, N₂ generated by the reaction as shown in the following equation (2) reacts with the etching gas (CH₂F₂) continuously supplied, and the etchant (F) for the Si₃N₄ film is generated in a large amount on the basis of the following equation (3), so that the etching for the Si₃N₄ film further proceeds.

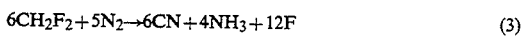
$$6CH_2F_2 + 5N_2 \rightarrow 6CN + 4NH_3 + 12F \qquad (3)$$

At this time, in parallel to the reaction of the above equation (3), the reaction as shown in the following equation (4) is also generated.

$$3CH_2F_2 + N_2 \rightarrow 3CF_2 + 2NH_3 \qquad (4)$$

However, since CF₂ generated by the reaction of the equation (4) functions as an etchant for the SiO₂ film, in the condition that the Si₃N₄ film and the SiO₂ film are coexistent (in the condition that part of the SiO₂ film of the bottom layer is exposed by the etching of the Si₃N₄ film), the SiO₂ film is etched by the etchant of CF₂, which makes it difficult to etch the Si₃N₄ film with a high selectivity.

To solve the above problem, there is provided an effective etching method. In this method, there are prepared a first radio frequency bias value corresponding to a first etching condition with a high selectivity in the stable state; and a second radio frequency bias value corresponding to a second etching condition with a low selectivity in a stable state. Thus, an etching is performed by alternately performing the switching between the above first radio frequency bias value and the above second radio frequency bias value so that an etching condition near the above first etching condition with a high selectivity can be obtained on average.

The preferable result can be obtained by the following manner: Namely, there are prepared a first radio frequency bias value wherein, under the condition that a first film and a second film different in the etching characteristic from the first film are coexistent, the etching selectivity to the first film is high but the etching rate to the first film is low; and a second radio frequency bias value wherein, under the condition that only the first film exists, the selectivity to the first film is low but the etching rate to the first film is high. Thus, the first is etched by alternately performing the switching between the above first radio frequency bias value and the second radio frequency bias value.

The etching may be performed in the following manner: Namely, there are prepared a first radio frequency bias value corresponding to a first etching gas composition with a high selectivity in the stable state; and a second radio frequency bias value corresponding to a second etching gas composition with a low selectivity. Thus, the etching is performed by alternately performing the switching between the above first radio frequency bias value and the above second radio frequency bias value so that the etching gas composition near the above first etching gas composition with a high selectivity can be obtained.

Further, the etching may be performed by alternately performing the switching between a first radio frequency bias value for more generating a first etching gas of reducing the etching selectivity, and a second radio frequency bias value for less generating the first etching gas.

In addition, the etching may be performed as follows: namely, in the case that under the state that a second film is formed on the article to be etched and a first film different in the etching characteristic from the second film is deposited on the first film, the first film is etched by applying a radio frequency bias on the article to be etched, the above radio frequency bias value is switched between the case that the second film is covered with the first film and the case that part of the second film is exposed on the surface, to thus etch the first film while avoiding the unnecessary etching for the above second film.

For these etching operations, there may be used an etching apparatus having a radio frequency bias control means capable of alternately performing the switching between a first radio frequency bias value corresponding to a first etching condition with a high selectivity in the stable state, and a second radio frequency bias value corresponding to a second etching condition with a low selectivity in the stable condition.

Further, there may be used an etching apparatus having a radio frequency bias control means capable of alternately performing the switching between a first radio frequency bias value with high selectivity to a first film but with a low etching rate to the first film under the condition that the first film and a second film different in the etching characteristic from the first film are coexistent; and a second radio frequency bias value with a low selectivity to the first film but a high etching rate to the first film under the condition that only the first film exists.

In addition, there may be used an etching apparatus having a radio frequency bias applying means for previously setting a first radio frequency bias value corresponding to a first etching gas composition with a high selectivity in the stable state, and a second radio frequency bias value corresponding to a second etching gas composition with a low selectivity in the stable state; and a radio frequency bias control means capable of alternately performing the switching between the first radio frequency bias value and the second radio frequency bias value of the radio frequency bias applying means so that an etching gas composition near the first etching gas composition with a high selectivity can be obtained on average.

As the above etching apparatus, there may be used an etching apparatus having a radio frequency bias applying means of previously setting a first radio frequency bias value for more generating a first etching gas of reducing the etching selectivity, and a second radio frequency bias value for less generating the first etching gas; and a radio frequency bias applying means capable of alternately performing the switching between the first radio frequency bias value and the second radio frequency bias value of the radio frequency bias applying means.

The etching apparatus is so constructed that a radio frequency bias is applied to a sample including a second film and a first film having a different etching characteristic deposited on the second film, to thus etch the first film; and this apparatus has a radio frequency bias control means capable of switching the radio frequency bias value between the case that the second film is covered with the first film and the case that part of the second film is exposed on the surface.

The above etching apparatus has a radio frequency bias control means capable of independently controlling a plasma generating means and a radio frequency bias applying means, and of switching the radio frequency bias value of the radio frequency bias applying means.

In a method of manufacturing a semiconductor integrated circuit device having a process of applying a radio frequency bias on a semiconductor substrate including a second film and a first film having a different etching characteristic deposited on the second film, thereby etching the first film, the first film can be etched while switching the radio frequency bias value between the case that the second film is covered with the first film and the case that part of the second film is exposed on the surface.

In a method of manufacturing a semiconductor integrated circuit device having a process of applying a radio frequency bias on a semiconductor substrate including a second film and a first film having a different etching characteristic deposited on the second film, thereby etching the first film, the first film can be etched while alternately performing the switching between a first radio frequency bias value with a high selectivity to the first film but with a low etching rate to the film film under the state that the first film and the second film are coexistent, and a second radio frequency bias value with a low selectivity to the first film but with a high etching rate to the first film under the state that only the first film exists.

In a method of manufacturing a semiconductor integrated circuit device having a process of applying a radio frequency bias on a semiconductor substrate including a second film and a first film having a different etching characteristic deposited on the second film, thereby etching the first film, the first film can be etched while previously setting a first radio frequency bias value corresponding to a first etching gas composition with a high selectivity to the first film in the stable state, and a second radio frequency bias value corresponding to a second reaction gas composition with a low selectivity to the first film; and alternately performing the switching between the first radio frequency bias value and the second radio frequency bias value so that the etching gas composition near the first etching gas composition can be obtained on average.

In a method of manufacturing a semiconductor integrated circuit device having a process of applying a radio frequency bias on a semiconductor substrate including a second film and a first film having a different etching characteristic deposited on the second film, thereby etching the first film, the first film can be etched while alternately performing the switching between a radio frequency bias value for more generating a first etching gas of reducing the etching selectivity to the first film, and a second radio frequency bias value for less generating the first reaction gas.

Namely, by allowing the etching for the first film to proceed when the radio frequency bias with a high value is applied, and by allowing the etching to proceed while discharging the sub-reaction products when a radio frequency bias with a low value is applied, it is possible to etch the first film with a high selectivity.

Figure 8:
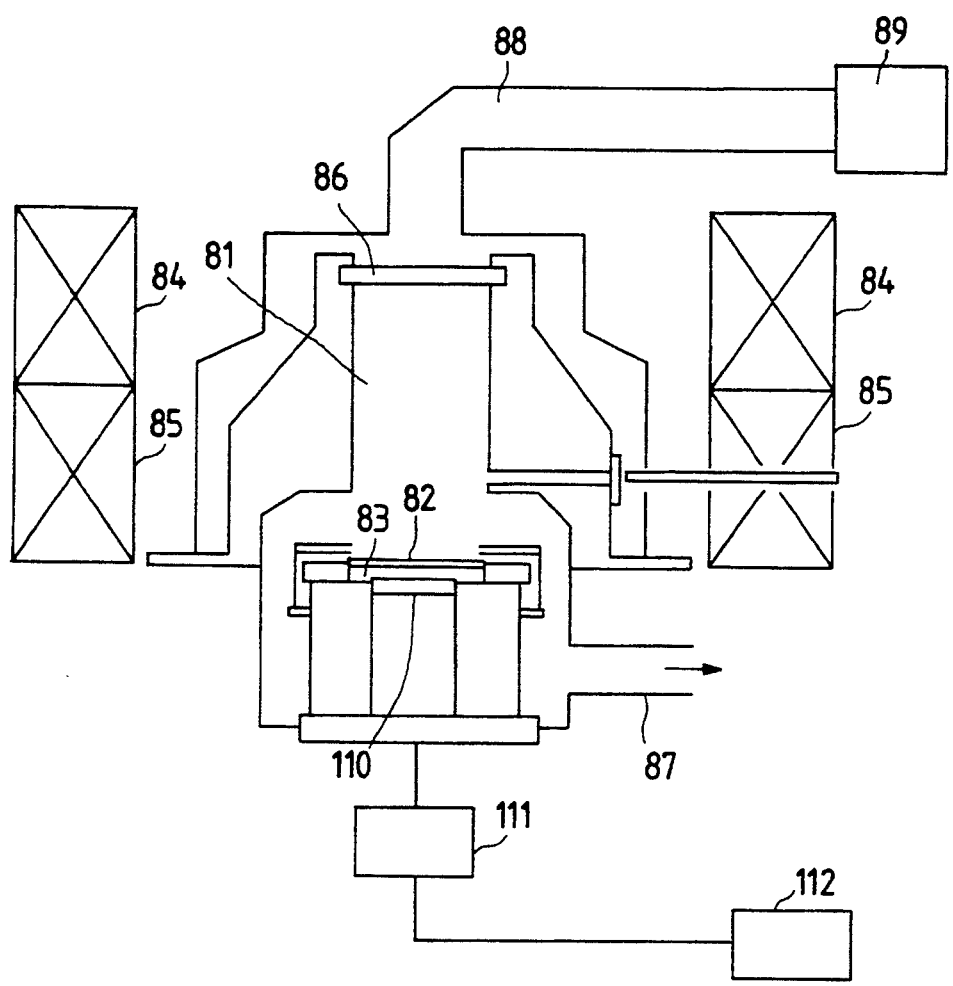
FIG. 8 is a whole construction view showing a plasma etching apparatus of microwave ECR system used a further example.
Figure 9:
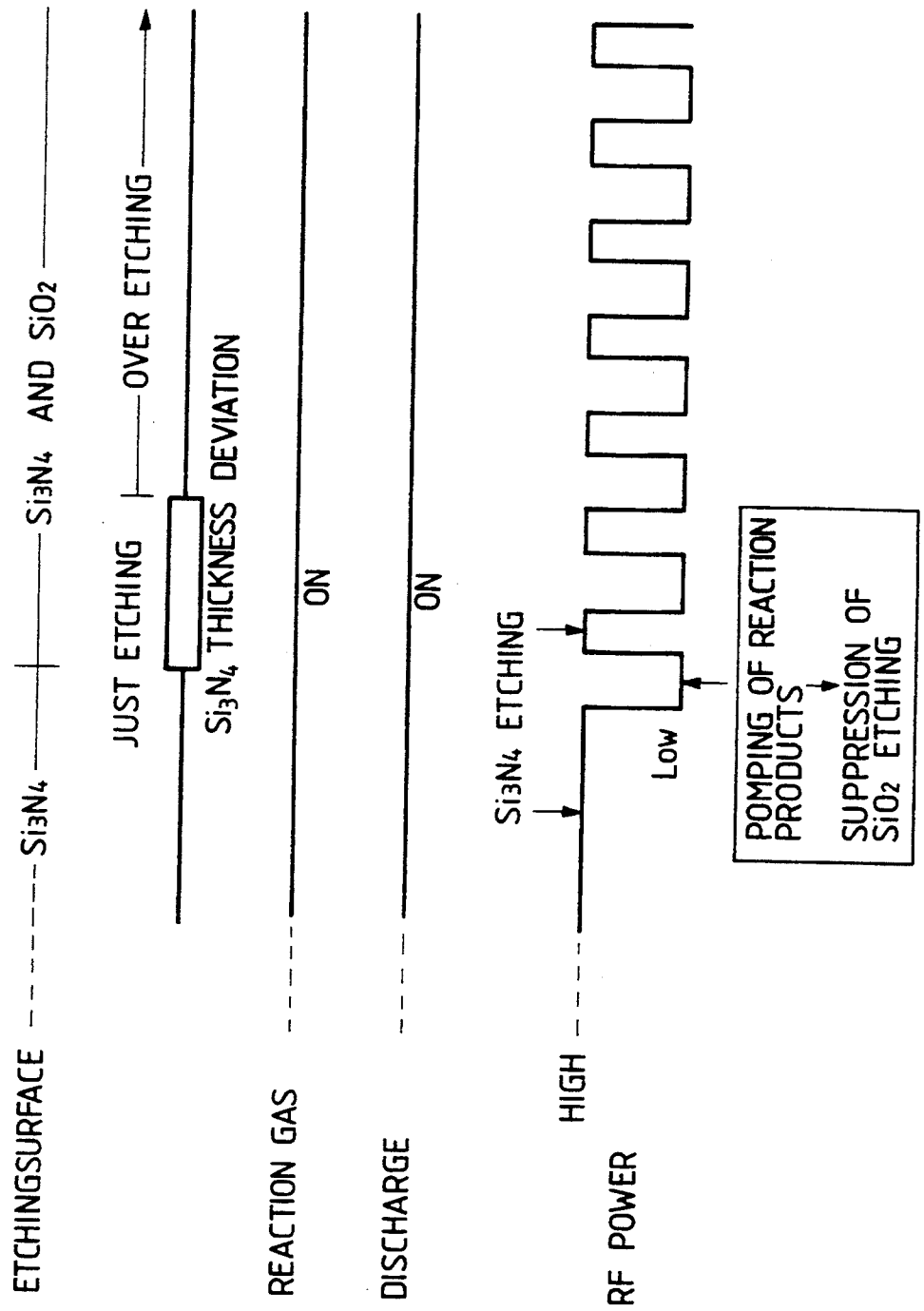
FIG. 9 is a timing chart in etching a $Si_3N_4$ film deposited on a $SiO_2$ film using the plasma etching apparatus as shown in FIG. 8.

FIG. 8 shows the whole construction of microwave ECR system plasma etching apparatus.

A stage 83 for placing a sample 82 such as a semiconductor substrate was provided in an etching chamber 81 of the above etching apparatus. The sample 82 was carried in the etching chamber 81 through a robot hand or the like, and was horizontally placed on the stage 83. Solenoid coils 84 and 85 were disposed around the outer periphery of the etching chamber 81 for forming a magnetic field in the vicinity of the stage 83.

An etching gas was supplied from an external gas supply source in the etching chamber 81 through a gas introducing port 86. The interior of the etching chamber 81 was set at a desired vacuum degree by a vacuum pump (not shown) connected to a gas discharge port 87.

A wave guide 88 was provided over the etching chamber 81. A magnetron 89 for generating a microwave with a frequency of, for example 2.54 GHz was provided on the deep end portion of the wave guide 88. The microwave generated at the magnetron 89 excites the reaction gas within the etching chamber 81 in cooperation with the magnetic field formed by the solenoid coils 84 and 85, to form a high density plasma in the vicinity of the stage 83.

A specified RF power was applied on the sample 2 on the stage 83 from an RF power supply 111 through the electrode 110. The RF power supply 111 was connected to a controller 112 for alternately applying the RF power with the predetermined two values to the stage 83.

FIG. 8 is a timing chart of an etching for a $Si_3N_4$ film deposited on a $SiO_2$ film using the above plasma etching apparatus.

During the etching for the $Si_3N_4$ film, the etching gas was continuously supplied in the etching chamber 81, and the plasma discharge by the microwave was continuously performed. In the case that the film to be etched was only the $Si_3N_4$ film, of the predetermined two RF power values, the higher RF power value was applied to accelerate the etching. In addition, at this time, the RF power value applied may be further higher than the higher RF power value applied near the termination of the etching for the $Si_3N_4$ film.

In consideration of the deviation in etching for the $Si_3N_4$ film at its termination, the RF power value was alternately changed up and down with a specified interval of time when the etching for the $Si_3N_4$ film come to the termination. Namely, in such an over-etching state that the $Si_3N_4$ film and the $SiO_2$ film are coexistent, the etching for the $Si_3N_4$ film is allowed to proceed when the RF power (High) with a high value is applied, and the sub-reaction products (etchant for a $SiO_2$ film) is discharged to the outside of the etching chamber 81 when the RF power (Low) with a low value is applied, to thus suppress the etching for the $SiO_2$ film as an bottom layer. By alternately repeating this operation, the etching for the $Si_3N_4$ film is performed while ensuring the high selectivity.

Next, another example in which the above etching method is applied to a process of forming opening portions in an emitter area of a bipolar transistor will be described.

Figure 10:
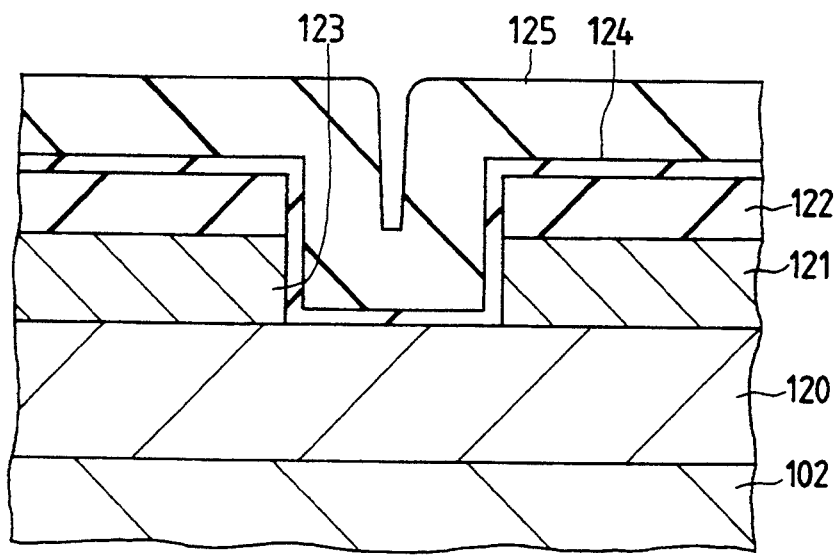
FIGS. 10 to 11 are processes showing still a further example of the present invention.

First, as shown in FIG. 10, a semiconductor substrate 102 was prepared. On a base area 120 of the semiconductor substrate 102, a polycrystalline Si film 121 and a $SiO_2$ film 122 were sequentially deposited. An opening 123 for forming an emitter area was formed on part of the base area 120. A thin $SiO_2$ film 124 for reducing the damage of the semiconductor substrate 102 due to etching was deposited within the opening 123 and on the $SiO_2$ film 122, on which a $Si_3N_4$ film 125 was deposited.

Figure 11:
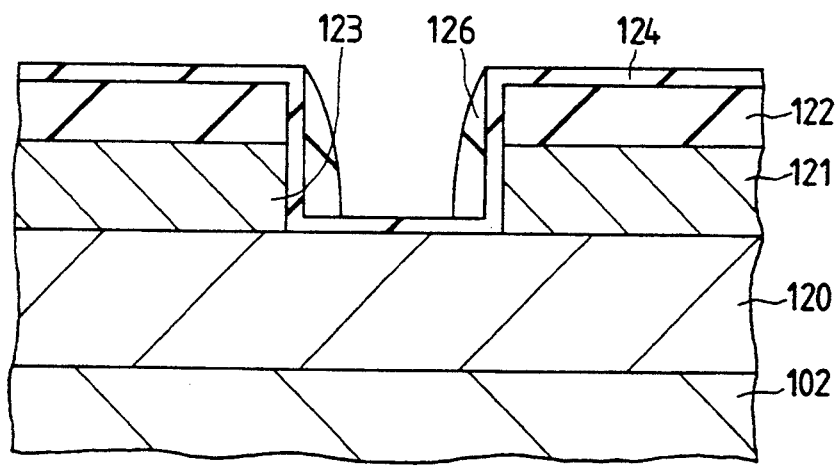

Next, as shown in FIG. 11, the $Si_3N_4$ film 125 on the semiconductor substrate 102 was etched back using the plasma etching apparatus as shown in FIG. 8, to form side wall spacers 126 on the side walls of the opening 123. In this etching-back process, it is required to stop the etching in such a state that the $SiO_2$ film 124 remains on the bottom portion of the opening 123.

In the initial stage of the etching for the $Si_3N_4$ film 125, the RF power applied to the semiconductor substrate 102 was set at 100W for stably starting the etching. The processing pressure within the etching chamber 81 was set at 20 mTorr. As the etching gas, $CH_2F_2$ was used, and the flow rate thereof was set at 30 sccm. At this time, the etching for the $Si_3N_4$ film 125 proceeded at an etching rate of 200 nm/min.

Next, the RF power value applied to the semiconductor substrate 102 was alternately changed up and down when the etching for the $Si_3N_4$ film 125 come to termination. The RF power value applied was set at 80W (High) and 20W (Low), and the applying time thereof was set at 3 sec and 6 sec. At this time, the etching for the $Si_3N_4$ film 125 proceeded at the etching rate of 150 nm/min (High) and 10 nm/min (Low).

Thus, the etching for the $Si_3N_4$ film 125 is allowed to proceed when the higher RF power (High) is applied, and the sub-reaction products ($CF_2$ etc.) are pumped to the outside of the etching chamber 81 when the lower RF power (Low) is applied, which makes it possible to perform the etching for the $Si_3N_4$ film 125 with a high selectivity.

Example 4

Next, the example in which the above etching method is applied to processes of manufacturing a memory cell for a DRAM will be described.

First, of the manufacturing processes for the DRAM with a stack structure for forming an information storing capacitor over memory cell selecting MISFETs [see VLSI Technology (1990)], three processes requiring the selective etching for a $Si_3N_4$ film are shown in section as FIGS. 12 to 17.

Figure 12:
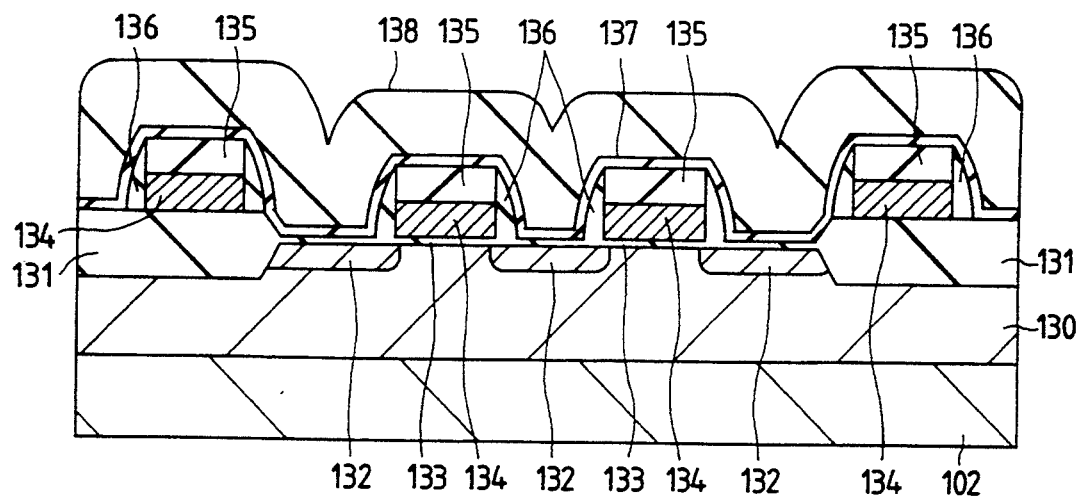
FIGS. 12 to 17 are processes showing still a further example of the present invention.

In FIG. 12, a p-type well 130 was formed on a semiconductor substrate 102 made from a p-type Si single crystal, and field insulating films 131 were formed on a device separating area of the main surface of the well 130. A n-channel type MISFET constituting a memory cell formed on the main surface of an active area of the p-type well 130 includes a n-type semiconductor area 132, a gate insulating film 133 and a gate electrode 134. A $SiO_2$ film 135 was formed on the gate electrode 134, and side wall spacers 136 of $SiO_2$ films were formed on the side walls of the gate electrode 135. A $Si_3N_4$ film 138 was deposited on the upper portion of the MISFET through a thin SiO$_2$ film 137.

Figure 13:
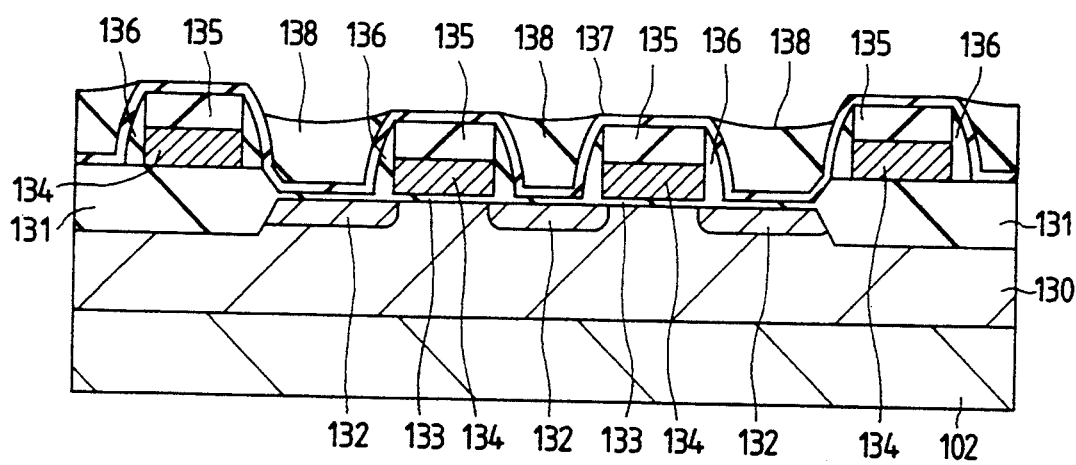

FIGS. 12 and 13 show the process of etching back the whole surface of the above Si$_3$N$_4$ film 138 for flattening the pattern steps between the memory cells. As shown in FIGS. 13, the etching was performed as follows: namely, the etching was stopped in the state that the Si$_3$N$_4$ film 138 and the SiO$_2$ film 137 as a bottom layer remained, and further, in order that the Si$_3$N$_4$ film 138 uniformly remained between the MISFETs, the etching was performed using the plasma etching apparatus as shown in FIG. 8 under the condition that two RF power values (High, Low) and the interval between which the RF power values were changed up and down were optimized.

Figure 14:
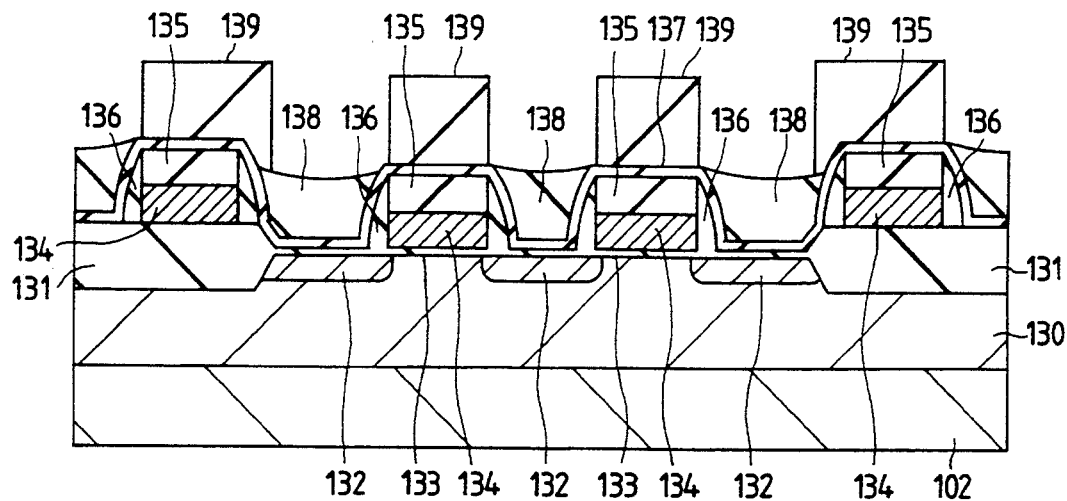
Figure 15:
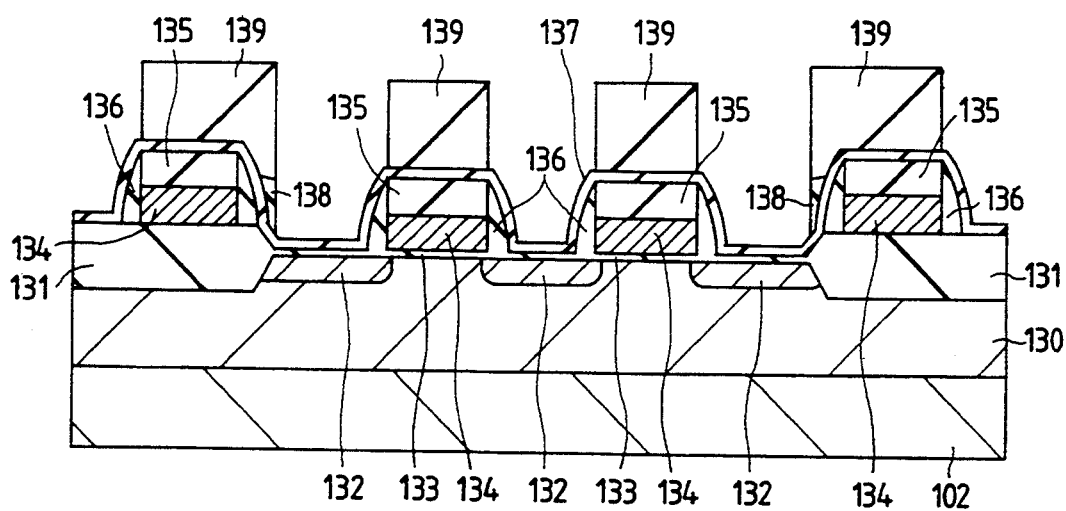

FIGS. 14 and 15 show the processes for etching the Si$_3$N$_4$ film 138 using a photoresist 139 as a mask for forming contact holes for drawing between the MISFETs. In this case, the SiO$_2$ film 137 was largely exposed on the etching surface from the initial stage of etching depending on the positional deviation of the photoresist 139 and the like. Accordingly, in this etching process, the RF power was changed up and down from the beginning, or a higher RF power for stably starting the etching was applied for several seconds, and then the RF power was changed up and down.

Figure 16:
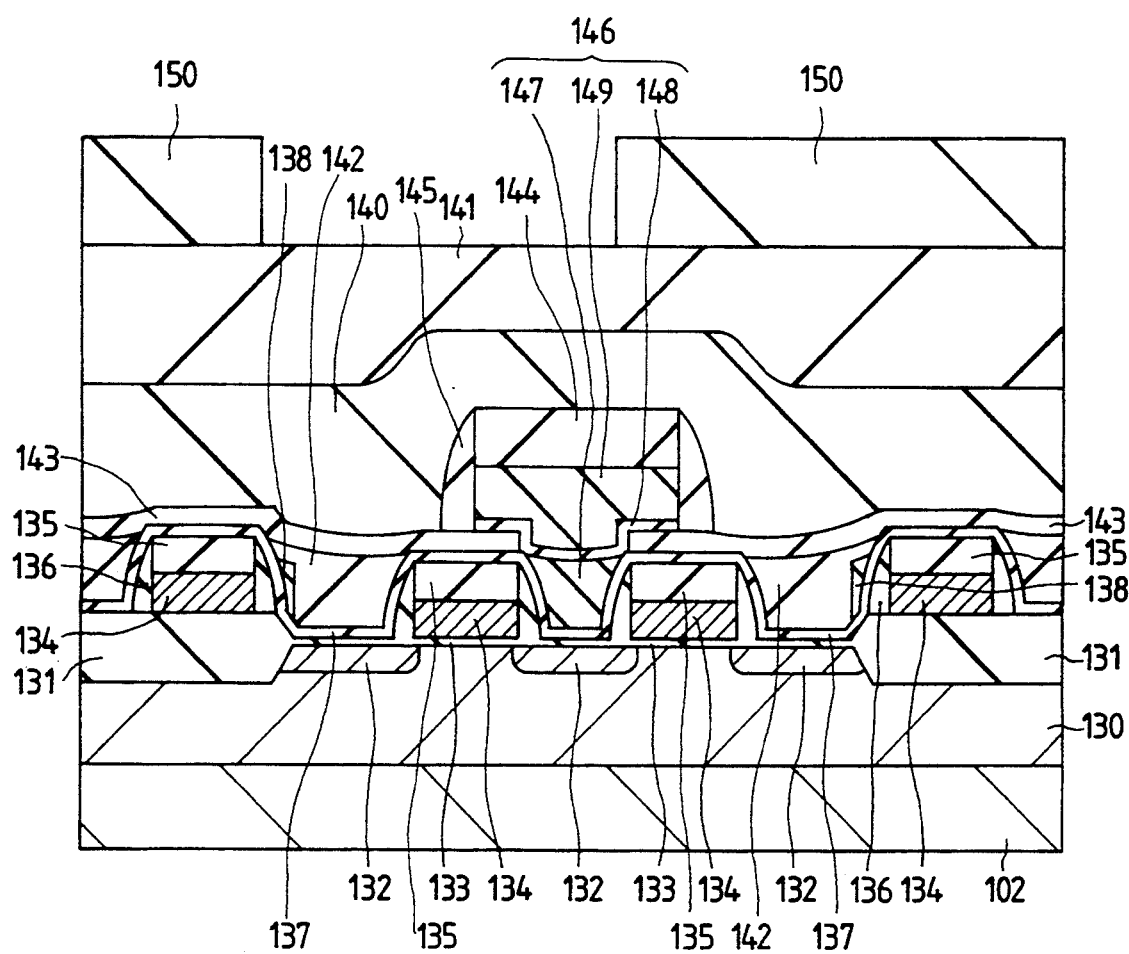
Figure 17:
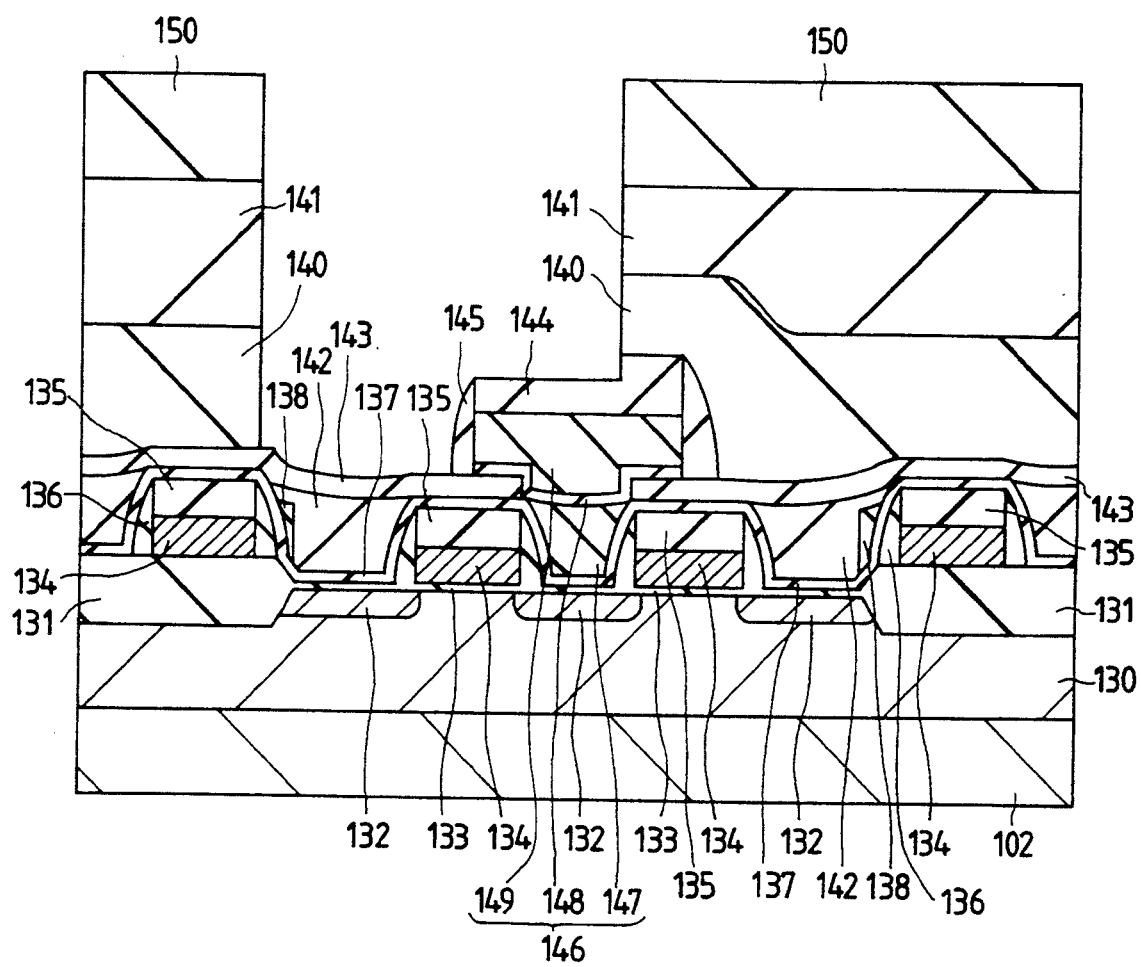

FIGS. 16 and 17 are processes for forming a contact hole with a step at an opening portion. As a flattening film, a Si$_3$N$_4$ film 140 was used, and a BPSG (Boron-doped Phosph Silicate Glass) film 141 was deposited thereon, which was made in reflow for performing the uniform flattening. In the figure, reference numerals 142 and 143 and 144 indicate SiO$_2$ films, and 145 is a side wall spacer formed of a SiO$_2$ film, and 146 is a bit line. This bit line 146 includes a polycrystalline Si films 147, 148, and a tungsten silicide film 149 in this order from the lower layer. Reference numeral 150 indicates a photoresist.

The etching proceeds in the order of the etching for the BPSG film 141; the etching for the Si$_3$N$_4$ film 140; and the etching in the state that the Si$_3$N$_4$ film 140 and the SiO$_2$ films (144, 143, 142) are coexistent, so that the step-etching is performed in combination of only etching for the BPSG film 141 and the etching in this example in which the two RF power values are changed up and down.

Example 5

Next, of the manufacturing processes for the DRAM with a trench structure for forming an information storing capacitors in trenches formed on the semiconductor substrate, the process requiring the selective etching for the Si$_3$N$_4$ film is shown in FIGS. 18 to 22.

Figure 18:
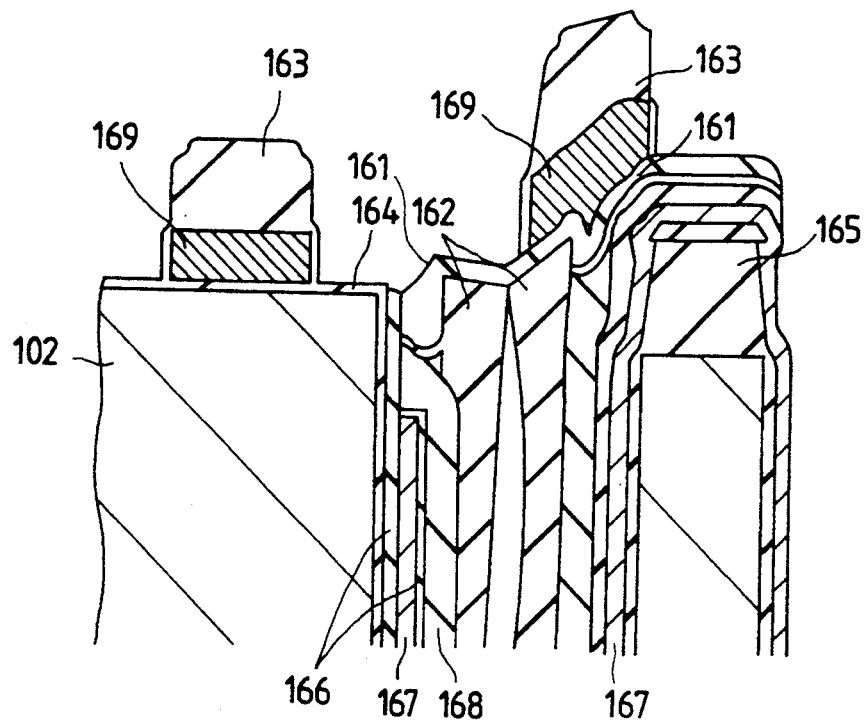
FIGS. 18 to 22 are processes showing an additional example of the present invention.
Figure 19:
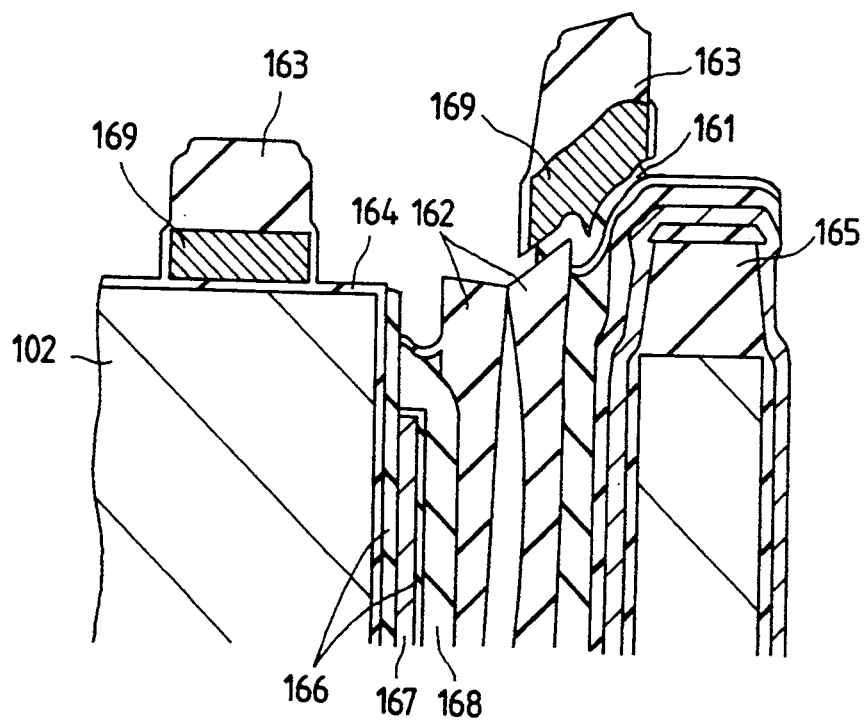

In this process, a contact hole is formed on the upper portion of a trench, and FIGS. 18 and 19 show the process of removing a Si$_3$N$_4$ film 161 on the upper portion of the trench. In these figures, reference numerals 162, 163 and 164 indicate SiO$_2$ films; 165 is a field insulating film formed of a SiO$_2$ film; 166 is a Si$_3$N$_4$ film; 167 and 168 are polycrystalline Si films; and 169 is a gate electrode.

Figure 20:
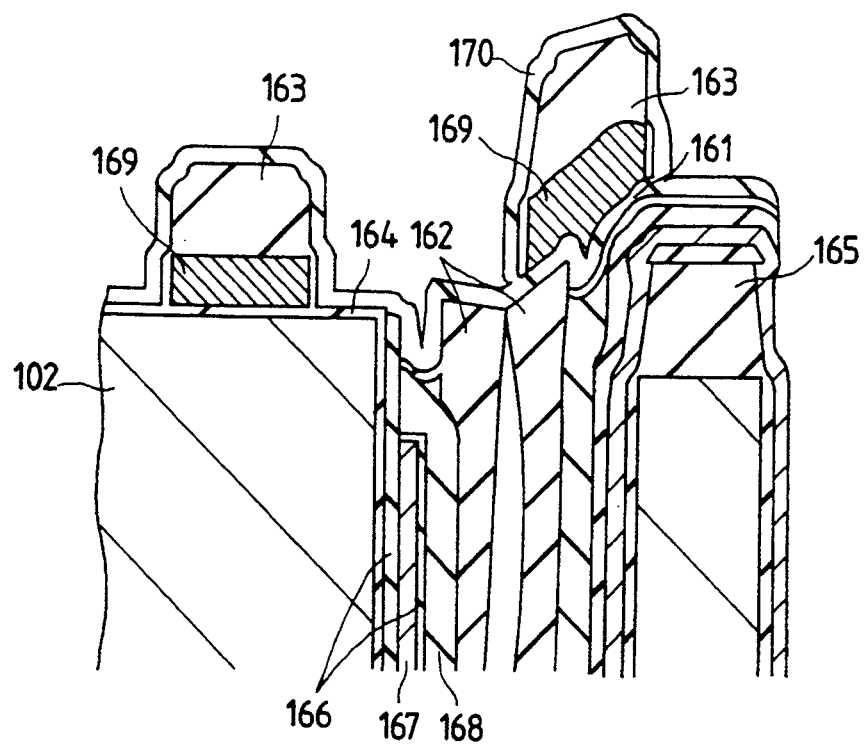
Figure 21:
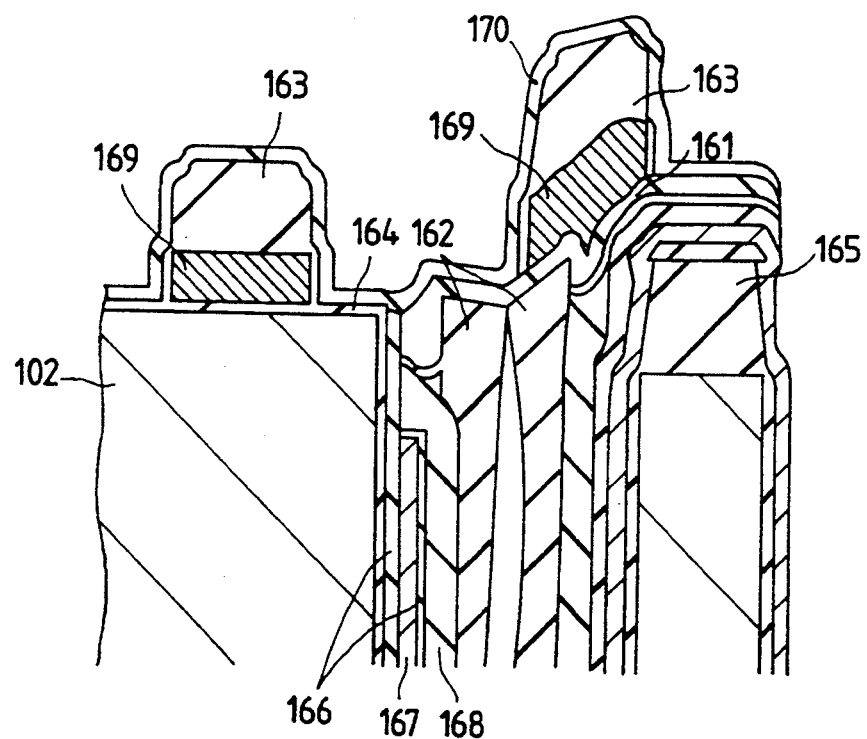

As shown in FIG. 20, since there is a process for forming a different Si$_3$N$_4$ film 170 before forming the contact hole, if the Si$_3$N$_4$ film 170 is deposited in such a state as shown in FIG. 18, the thicknesses of the Si$_3$N$_4$ films 161 and 170 become thick on the upper portions of the polycrystalline Si films 167 and 168 within the trench as shown in FIG. 21, which makes it difficult to form the contact hole.

Figure 22:
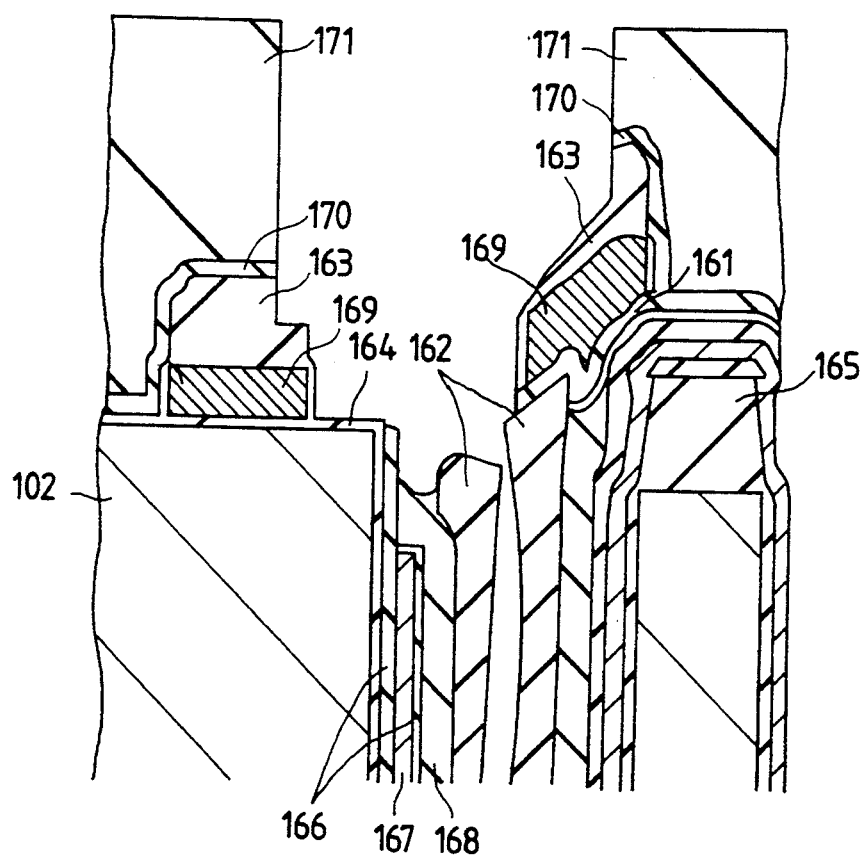

For this reason, as shown in FIG. 19, the Si$_3$N$_4$ film 161 on the upper portion of the trench was previously removed by etching, after which the Si$_3$N$_4$ film 170 was deposited as shown in FIG. 20. Thus, as shown in FIG. 22, the contact hole was formed using the photoresist 171 as a mask.

Even in the above process, by use of the etching method of this example according to the present invention, it is possible to etch the Si$_3$N$_4$ films 161 and 170 with a high selectivity.

As is apparent from the above description, according to the present invention, it is possible to approximately independently control the supply time of an etchant for the surface of an article to be etched and the irradiation of etching ions, and hence to form the fine pattern with vertical side walls in section with a high selectivity irrespective of the aspect ratio. This makes it possible to extremely improve the pattern etching accuracy in an ULSI and the like. Accordingly, in particular, the present invention is effective for forming a gate with a thin bottom SiO$_2$ film and a trench capacitor with a high aspect ratio structure. Further, the present invention enables the etching with low damage, and is extremely effective in a practical use.

In addition, according to the present invention, the etching for a Si$_3$N$_4$ film is allowed to proceed when the higher radio frequency bias is applied, and the etching is allowed to proceed while pumping the sub-reaction products when the lower radio frequency bias is applied, so that it is possible to etch the Si$_3$N$_4$ film deposited on the SiO$_2$ film with a high selectivity.

What is claimed is:

1. An etching method for etching an exposed portion of an article to be etched placed in a reaction vessel using a plasma of an etching gas, comprising the step of:
periodically repeating the switching between a first state that an average thickness of an ion sheath formed on the surface of said article to be etched and an average energy of etching ions are respectively taken as d$_1$ and V$_{S1}$, and a second state that the average thickness of an ion sheath and the average energy of etching ions are respectively taken as d$_2$ and V$_{S2}$, thereby etching said article to be etched.

2. An etching method according to claim 1, wherein said periodical switching between said first state and said second state is performed by intermittently applying a radio frequency power.

3. An etching method according to claim 2, wherein said plasma is generated by applying a microwave to said etching gas, and said high frequency power is intermittently applied while said microwave with a constant intensity is applied.

4. An etching method according to claim 1, wherein said periodical switching between said first state and said second state is performed by intermittently applying a magnetic field having different intensities to said plasma.

5. An etching method according to claim 1, wherein when said d$_1$ is smaller than d$_2$, said V$_{S1}$ is smaller than V$_{S2}$.

6. An etching method according to claim 1, wherein said periodical switching between said first state and said second state is performed with a cycle of 1 sec or less.

7. An etching method according to claim 1, wherein trenches with different widths and with substantial the same depth are formed.

8. An etching method according to claim 1, wherein said article to be etched is composed of a plurality of films with different etching characteristics from each other, and which is periodically applied with a radio frequency power with different intensities.

9. An etching method according to claim 8, wherein a plurality of said films are deposited on a substrate.

10. An etching method according to claim 9, wherein a plurality of said films comprises a $SiO_2$ film and a $Si_3N_4$ film laminated on a semiconductor substrate.

11. An etching method according to claim 10, wherein said etching gas comprises $CH_2F_2$.

12. An etching apparatus comprising:
a reactor;
a wafer stand provided in said reactor;
a means for generating a plasma of an etching gas in said reactor;
a means for applying a radio frequency power on an article to be etched placed on said wafer stand; and
a means for periodically and repeatedly switching an average thickness of an ion sheath formed on the surface of said article to be etched and an average energy of etching ions.

13. An etching apparatus according to claim 12, wherein said means for periodically and repeatedly switching an average thickness of said ion sheath and an average energy of etching ions comprises a means for intermittently applying said radio frequency power to said article to be etched.

14. An etching apparatus according to claim 12, wherein said means for periodically and repeatedly switching an average thickness of said ion sheath and an average energy of etching ions comprises a means for applying a magnetic field having different intensities to said plasma.

15. An etching apparatus according to claim 12, wherein said etching apparatus comprises a microwave plasma etching apparatus.

16. An etching apparatus according to claim 12, wherein said means for generating said plasma comprises a helical resonance type plasma generating means and a triode type plasma generating means.

* * * * *